United States Patent [19]
Le

[11] Patent Number: 5,594,627
[45] Date of Patent: Jan. 14, 1997

[54] CIRCUIT CARD RETAINER

[75] Inventor: Bao G. Le, Orange, Calif.

[73] Assignee: AST Research, Inc., Irvine, Calif.

[21] Appl. No.: 267,601

[22] Filed: Jun. 28, 1994

[51] Int. Cl.$^6$ .................................................. H05K 7/14
[52] U.S. Cl. ........................ 361/801; 361/752; 361/759; 361/796; 361/802
[58] Field of Search ..................... 361/752, 796, 361/754, 756, 759, 798, 801, 802; 211/41; 439/65, 61, 154–159, 374, 377; 403/16, 321, 330

[56] References Cited

U.S. PATENT DOCUMENTS

| | | | |
|---|---|---|---|
| 3,696,936 | 10/1972 | Straccia et al. | 211/41 |
| 3,950,057 | 4/1976 | Calabro | 339/65 |
| 4,098,046 | 7/1978 | Papa | 52/716 |
| 4,550,362 | 10/1985 | Reimer . | |
| 4,861,277 | 8/1989 | Bina | 439/377 |
| 5,191,514 | 3/1993 | Kabat et al. . | |
| 5,277,615 | 1/1994 | Hastings et al. . | |

Primary Examiner—Leo P. Picard
Assistant Examiner—Y. Whang
Attorney, Agent, or Firm—Lyon & Lyon

[57] ABSTRACT

A circuit card retainer for securing a circuit card within a circuit card receiving channel to mitigate the possibility of a circuit card connector jarring loose from a motherboard slot during transit or other vibration or shock causing activity. The circuit card retainer securely retains an inner edge of the circuit card upon insertion of the circuit card, and allows the circuit card to be extracted only if the groove abutment is flexed away from the inner edge of the circuit card, thereby removing the obstruction caused by the groove abutment.

14 Claims, 7 Drawing Sheets

CIRCUIT CARD RETAINER

FIELD OF THE INVENTION

This invention relates to circuit cards for electronic equipment, and more specifically to a circuit card retainer for electronic systems such as computers.

BACKGROUND OF THE INVENTION

The installation of a circuit card is a convenient way of adding additional features to an electronic system. Examples of various types of circuit cards available for installation in computers are fax/modem cards, video cards, graphics accelerator cards, sound cards, and network interface cards, to name a few.

Many of today's computer systems are pre-configured with one or more circuit cards pre-installed by the manufacturer. A circuit card is typically installed into a computer system by removing the computer cover from the computer chassis, selecting an available and appropriate circuit card connector on the computer motherboard, lining up an outer edge of the circuit card with a chassis bracket slot, and lining up an inner edge of the circuit card with a circuit card receiving channel, also known as a card guide, sliding the edges of the circuit card down the respective chassis bracket slot and receiving channel, and inserting a connector of the circuit card into the motherboard connector.

The outer edge of the circuit card, positioned typically at the backside of the computer chassis, has a bracket screw assembly for securing the outer edge of the circuit card to the chassis bracket slot portion of the computer chassis. The inner edge is slid into the receiving channel and remains unsecured. Once the outer edge is screwed into place, the computer cover is replaced.

These computer systems are then shipped from the computer manufacturer to various recipients such as retailers, or directly to consumers. It has become apparent that these computers experience quite a bit of shock and vibration while in transit, since computer manufacturers receive complaints of inoperative or improperly functioning computers from the end users. It turns out that the pre-installed circuit cards were being jarred loose from the motherboard connectors. The vibration, or sudden jarring shock, causes the unsecured inner edge of the circuit card to slide back up the circuit card receiving channel. Since the outer edge is secured, the circuit card pivots about the bracket screw assembly, and a portion of the connector loses contact with the motherboard connector.

Sometimes, the solution to this problem is as easy as opening up the computer cover and ensuring that the connector is pressed firmly back into the motherboard connector. Other times, the pivoting of the circuit card out of the motherboard connector and up the circuit card receiving channel causes damage to one or more of the internal components, thereby requiring more involved repairs.

In an attempt to mitigate this problem, computer manufacturers started placing a foam strip, a piece of plastic, or a piece of metal on the inside of the computer cover. The idea behind this is that when the cover is replaced and secured to the chassis, the foam strip placed on the cover, or other material being used, comes into firm contact with the upper edge of the circuit card, thereby exerting a retaining force on the circuit card in the direction of the motherboard. With foam strips, the measurements did not have to be as accurate as with plastic or metal fillers since the foam strips would compress to accommodate the upper edges of the circuit cards.

This appeared to mitigate the problem of connectors jarring loose from the motherboard connectors, but the solution to that problem created problems of its own.

For example, many of the circuit cards being pre-installed by the computer manufacturers are manufactured by third party card manufacturers. Thus, there are no standard layouts for these boards. Many boards place various cable connectors on an upper edge of the circuit cards. In order to prevent damage or interference to these cables, the foam strips have to be cut so as to not run over these cable connectors.

Furthermore, these circuit cards typically come in two heights, the height being defined from the upper edge of the circuit card to the connector on the lower edge. Since computer systems are often custom configured, the location of these boards of various height are not always the same. Again, this requires that each individual computer system be custom fit with a foam strip according to the configuration of that particular system. The custom configuration of foam strips for placement on the computer cover is a labor intensive process which adds to the time and cost of manufacturing the computer systems.

Finally, with the passage of time, or with the constant insertion and extraction of various circuit cards, the foam strips start to break apart into little pieces which may cause interference with an internal fan, or various other internal components.

It should be noted that the problem of circuit cards jarring loose is a problem which faces individual computer owners as well as computer manufacturers. Some computer owners operate their computers in a mobile environment which can exert vibration and jarring shocks similar to that experienced by a computer being transported for delivery. In addition, consumers will often ship their computers during a move, or for repairs. Again, in such a situation, the circuit cards are exposed to vibrations and jarring shocks which tend to jar loose the connectors of the circuit cards from the motherboard connectors.

Therefore, a better solution is needed for securing and retaining a circuit card in the motherboard connector such that any vibration or jarring shocks resulting from shipping, or operation in a mobile environment, will not cause a circuit card to jar loose from the motherboard connector.

Furthermore, a better solution is needed which will minimize the amount of time spent in securing and retaining these circuit cards by creating a design which will be compatible with most of the standard circuit card configurations, regardless of where the upper edge cable connectors are placed, and ensuring that the solution does not create any by-products which could interfere with other internal components.

SUMMARY OF THE INVENTION

The circuit card retainer of the present invention secures and retains a circuit card connector in a motherboard or other computer system connector by preventing an inner edge of the circuit card from sliding back up the circuit card receiving channel, thereby preventing dislodging or loosening of the connector from the motherboard or other computer system connector.

The circuit card retainer of the present invention provides a solution to the problem of connectors dislodging from the motherboard connector, while at the same time reducing the time and cost that is added by the custom configuration of foam strips used in the prior art, as well as reducing the interference to the internal components caused by loose particles breaking off of these foam strips.

The circuit card retainer of the present invention comprises a pair of ridges which define a groove. A portion of the groove has an inclined surface area which comprises an abutment such that as the inner edge of a circuit card is inserted downward into the channel, the inclined surface area portion of the circuit card retainer flexes away from the inner edge of the circuit card, thereby allowing the card to travel into the receiving groove, thereby allowing the connector to be firmly inserted into the motherboard connector.

When the upper edge of the circuit card slides into the receiving groove past the abutment, the abutment snaps back to its original unflexed position. The location of the abutment is such that the card slides past the abutment just as the card connector reaches its fully inserted position in the motherboard connector. With the abutment snapped back to its original position, the abutment prevents the circuit card from sliding back up the groove, and therefore, a jarring shock or vibration will not cause the circuit card to slide back up the receiving groove. The location of the abutment within the groove can be varied so as to accommodate circuit cards of various heights.

In order for the card to be removed, the abutment must be flexed away from the inner edge of the circuit card so as to remove the abutment from the path of the circuit card being extracted as it slides out of the groove. A press tab portion can be implemented into the circuit card retainer which enables a simplified way of flexing the abutment portion out of the way of the circuit card being removed. Also, the press tab portion can be implemented such that the flexible abutment portion has no protrusions which extend beyond the circuit card retainer.

The receiving groove is defined by the pair of ridges which can be located on a surface to be placed inside a computer chassis, wherein the surface can define a divider or an inner wall of the chassis or an internal compartmentalizing box. The groove can also be an indentation in the surface, such that the groove can exist without the presence of ridge structures. The surface can also be staggered closer or further away from the chassis bracket slots to accommodate cards of varying lengths, the length being defined from the inner edge to the outer edge.

The concepts described above can be implemented in various ways. For example, the groove and abutment can be incorporated onto an individual circuit card retainer which is designed to be snapped onto a surface with preconfigured holes and/or slots for receiving a plurality of these individual circuit card retainers, whereby the location and number of these retainers can be custom configured according to the requirements of a particular computer system. In other words, additional circuit cards can be added by adding another individual circuit card retainer to an appropriate and corresponding hole on the preconfigured surface.

Furthermore, a surface integrated circuit card retainer can be designed with a plurality of grooves and abutments integral to a surface, wherein the surface acts as a divider, or as part of a compartment box within the chassis. This surface integrated circuit card retainer is capable of receiving a predetermined number of circuit cards corresponding to the number of grooves designed into the surface integrated circuit card retainer.

Accordingly, it is an object of the present invention to provide a new circuit card retainer.

It is a further object of the present invention to provide a circuit card retainer that will receive and secure a circuit card within the computer chassis via the motherboard connector or other computer system connector for receiving a circuit card connector.

An additional object of the present invention is to provide a circuit card retainer that will retain the circuit card in the motherboard connector even during vibration and shocks which may occur during transit, or operation in a mobile environment.

Another object of the present invention is to provide a circuit card retainer wherein an individual retainer can be added to a pre-existing surface within the computer chassis comprising holes and/or slots for receiving the individual retainers.

Yet another object of the present invention is to provide a circuit card retainer that can receive a plurality of circuit cards of varying height and varying length.

Further objects and advantages of the present invention will become apparent from a consideration of the drawings and ensuing description.

A PRIOR ART DEVICE

Figures 1, 2:
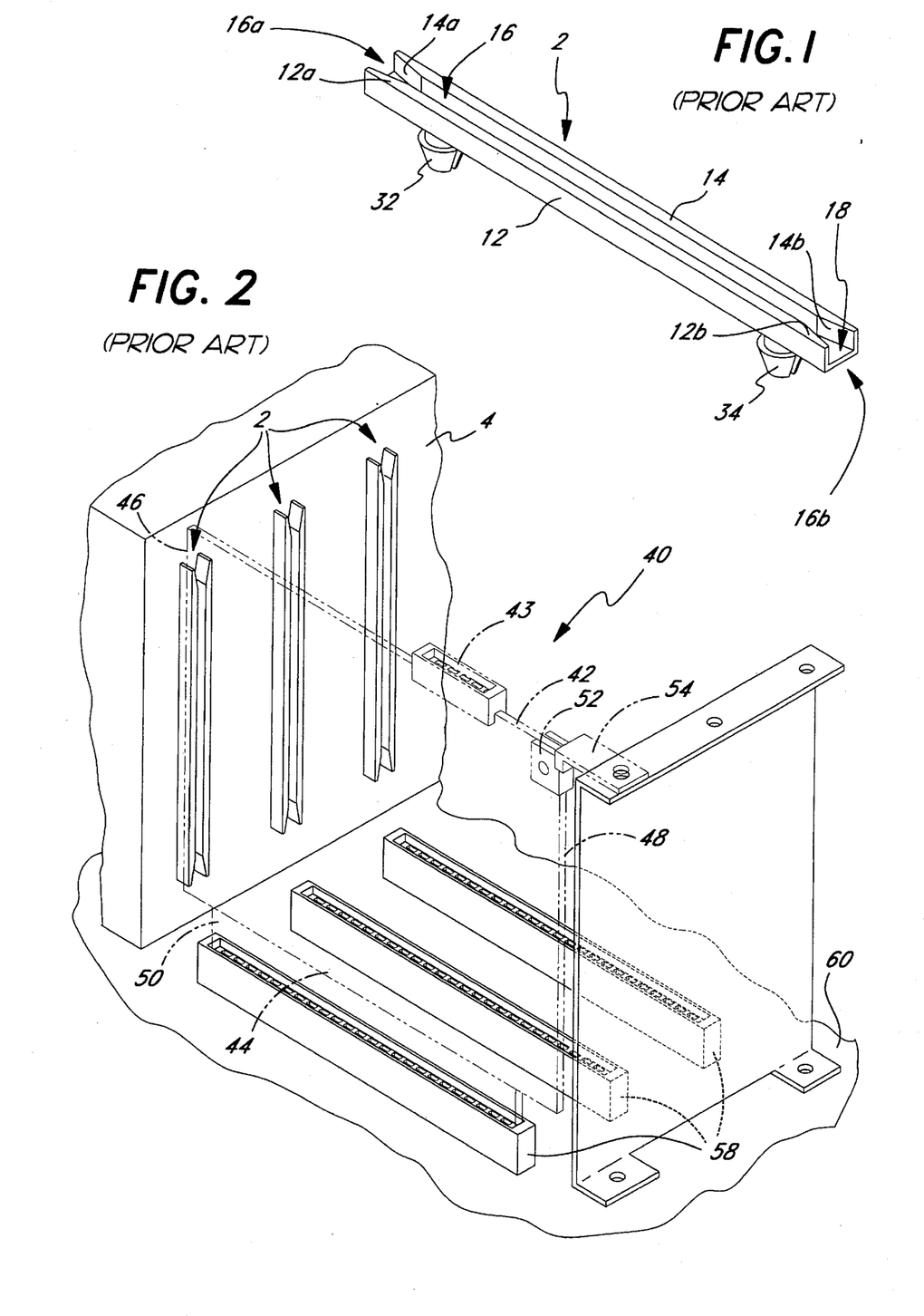
FIG. 1 is a perspective view of a prior art embodiment of a circuit card receiving channel.
FIG. 2 is a perspective view of a prior art embodiment of a circuit card receiving channel integral to a surface.

FIG. 1 illustrates a prior art embodiment of a circuit card receiving channel 2. The circuit card receiving channel 2 comprises a channel shaped member having a first ridge 12 and a second ridge 14 which define a first groove 16. The first groove 16 is on the same surface level as a surface plane 18.

The first ridge 12 comprises a first tapered end 12a and a second tapered end 12b. The second ridge 14 comprises a first tapered end 14a and a second tapered end 14b. The tapered ends 12a, 12b, 14a, and 14b are tapered outwardly in a direction so as to shape the first groove 16 into a funnel-shaped opening at a top end 16a of the first groove 16 and at a bottom end 16b of the first groove 16.

A first split-back tab 32 and a second split-back tab 34 are attached to the surface plane 18 on the opposite side from which the first ridge 12 and second ridge 14 are integral. A surface 4 (shown in FIG. 2) for receiving a plurality of circuit card receiving channels 2 comprises a plurality of holes and/or slots (not shown) for receiving the first split-back tab 32 and the second split-back tab 34 in such a way so as to place the circuit card receiving channel 2 in a position to receive a circuit card 40 (as shown in FIG. 2 in phantom).

FIG. 2 illustrates a prior art embodiment wherein a plurality of circuit card receiving channels 2 are integral to the surface 4 and one of the circuit card receiving channels 2 is shown with the circuit card 40 in place (shown in phantom).

The circuit card 40 comprises an upper edge 42, a lower edge 44, an inner edge 46, and an outer edge 48. A connector 50 is integral to the circuit card 40 on the lower edge 44. A bracket 52 and a bracket screw assembly 54 is attached to the circuit card 40 on the outer edge 48. Although not all circuit cards have cable interfaces, for disclosure purposes, the circuit card 40 illustrated here comprises a cable connector 43 located on the upper edge 42.

The surface 4 comprising a plurality of circuit card receiving channels 2 is shown positioned within a computer chassis 60 with a computer cover (not shown) removed from the computer chassis 60. As with most computer systems, a motherboard (not shown) is located along the bottom surface of the chassis 60. The motherboard typically comprises one or more motherboard connectors 58 for receiving an appropriate circuit card 40. The motherboard connectors 58 for receiving the connector 50 does not necessarily have to be located on the motherboard, but is typically positioned there. The computer chassis 60 typically comprises one or more chassis bracket slots 62 (shown in FIG. 7) positioned on the backside of the computer chassis 60.

DETAILED DESCRIPTION OF A PREFERRED EMBODIMENT

Figures 3, 4A, 4B:
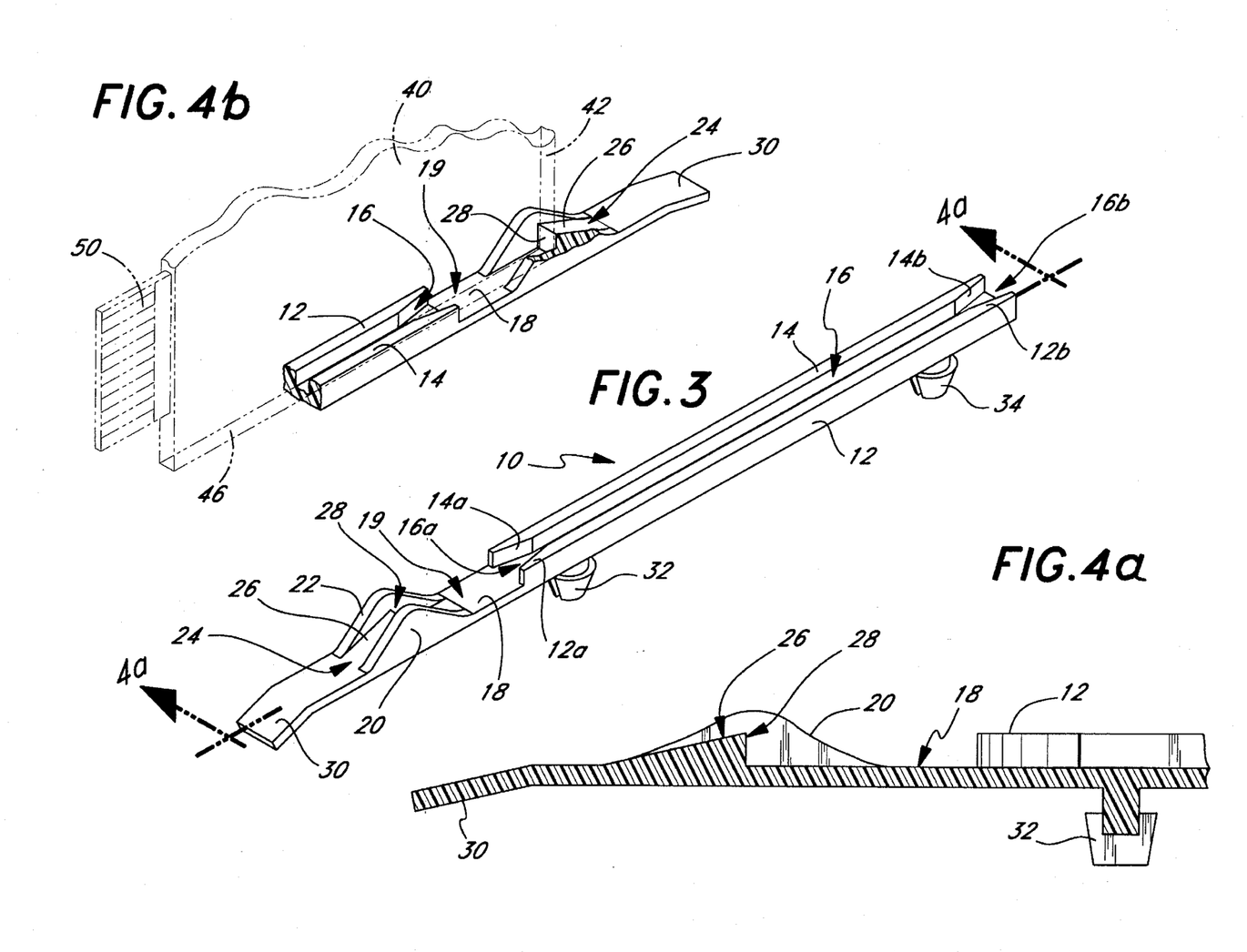
FIG. 3 is a perspective view of a preferred embodiment of an individual circuit card retainer.
FIG. 4a is a partial side cross-sectional view of the preferred embodiment of the individual circuit card retainer.
FIG. 4b is a partial perspective view of the preferred embodiment of the individual circuit card retainer showing an upper edge of an inner edge of a circuit card (shown in phantom) being retained in a groove by a groove abutment.

FIG. 3 illustrates a preferred embodiment of an individual circuit card retainer 10. In addition to the elements of the circuit card receiving channel 2, the individual circuit card retainer 10 further comprises a third ridge 20 and a fourth ridge 22 which define a second and shorter groove 24. The second groove 24 comprises an inclined second groove surface 26 which is on a higher surface level than the surface plane 18. The inclined second groove surface 26 rises above the surface plane 18 toward the first groove 16 to a point of maximum height above the surface plane 18 and then drops back down at a perpendicular angle to the surface plane 18. This point of maximum height defines an edge 28 of the inclined second groove surface 26. The edge 28 will hereinafter be referred to as a groove abutment 28.

The individual circuit card retainer 10 also comprises a press tab 30 for manually flexing the material which comprises the groove abutment 28 portion of the individual circuit card retainer 10 at a flex zone 19 so as to bring the groove abutment 28 to a surface level equal to or below the surface plane 18.

The materials used for the individual circuit card retainer 10, or other embodiments disclosed herein, can be a chosen from a variety of materials in varying thickness in order to provide the necessary rigidity and flexibility to enable the individual circuit card retainer 10, and other embodiments, to operate according to the present disclosure. Sample materials include, but are not limited to, molded plastic, ABS, polycarbonate, and PVC.

FIG. 4a is a partial side cross-sectional view through the individual circuit card retainer 10. This gives a better view of the relationship between the surface plane 18 and the groove abutment 28.

FIG. 4b shows the relationship between the upper edge 42 of the inner edge 46 of the circuit card 40 as it is being retained in the first groove 16 by the groove abutment 28.

Figure 5:
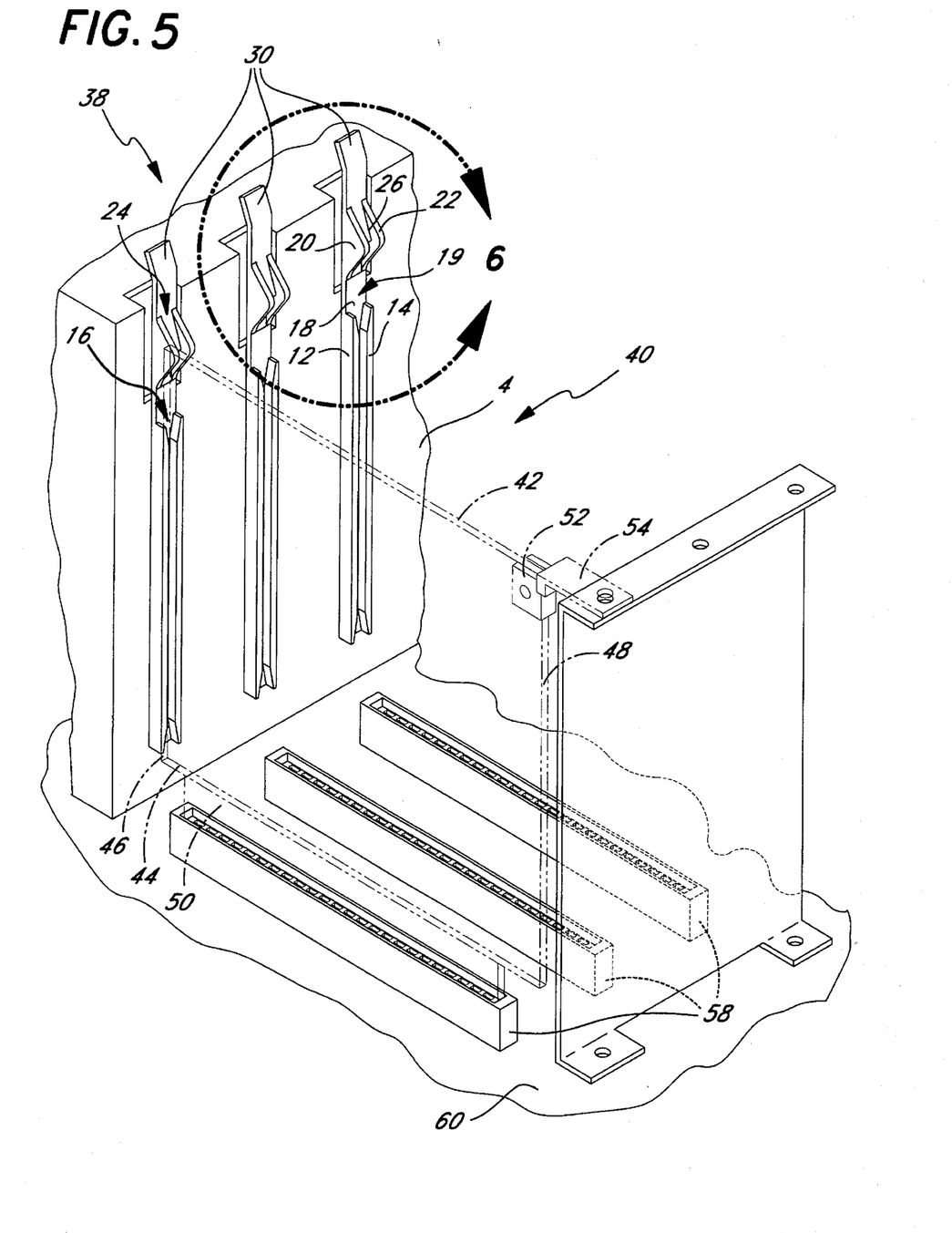
FIG. 5 is a perspective view of a circuit card (shown in phantom) inserted into a surface integrated circuit card retainer.

FIG. 5 illustrates a preferred embodiment wherein (i) the individual circuit card retainers 10 are attached to the surface 4 via holes and/or slots (not shown) and tabs 32 and 34 (as better shown in FIG. 3), or (ii) the individual circuit card retainers 10 are manufactured as part of a surface incorporating the individual circuit card retainers 10, hereinafter referred to as the surface integrated circuit card retainer 38.

Both embodiments have similar physical appearances once assembled, as illustrated in FIG. 5. However, in the surface integrated circuit card retainer 38 embodiment, the individual circuit card retainers 10 do not comprise the tabs 32 and 34. Regardless of which embodiment is utilized, both embodiments operate in a similar manner, as discussed in greater detail below.

Figure 6:
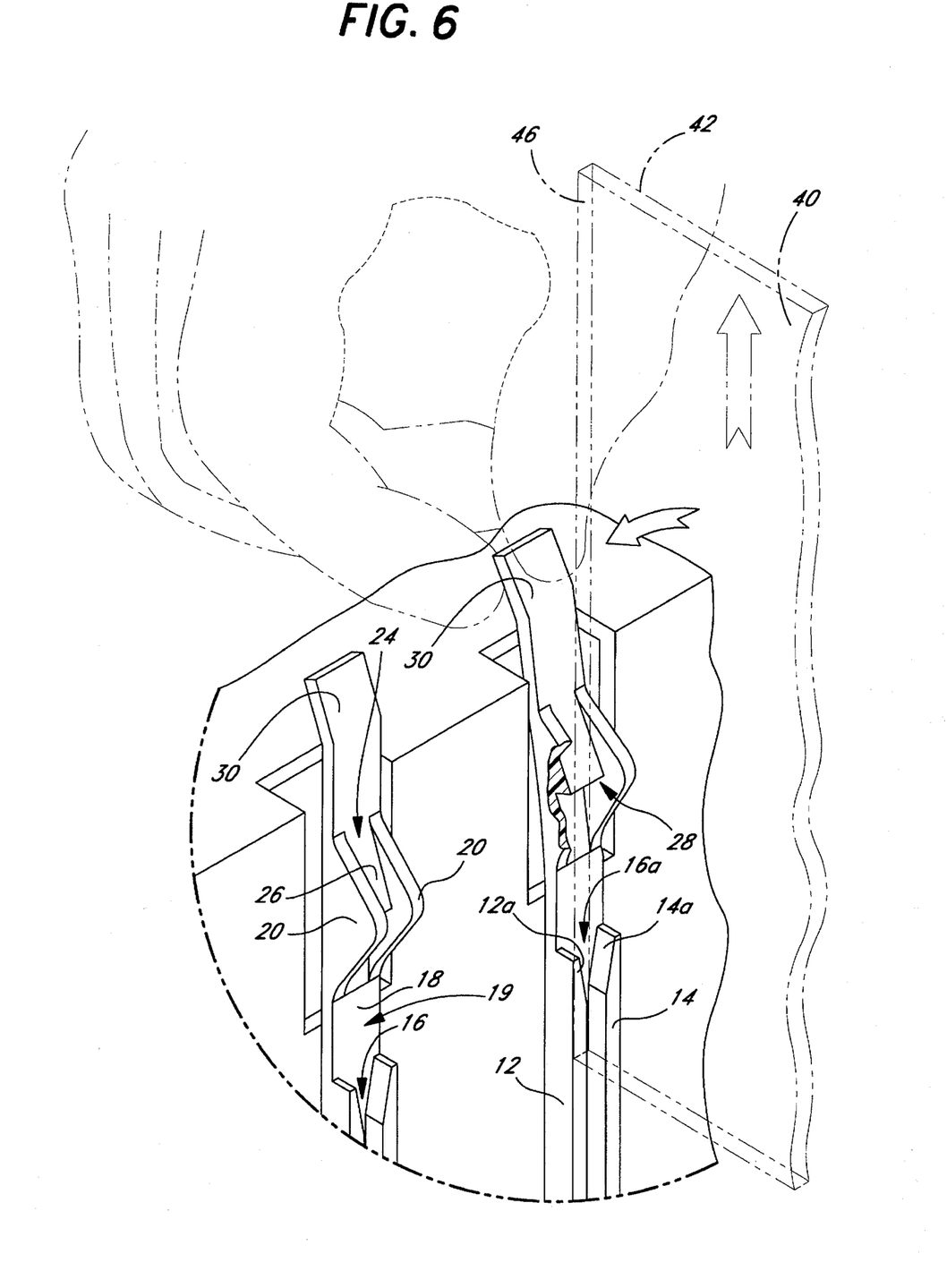
FIG. 6 is a detailed view of a portion of FIG. 5.

FIG. 6 is a detailed view of FIG. 5 wherein the press tab 30 is being pressed by a person such that the circuit card 40 can be removed from the first groove 16 of one of the individual circuit card retainers 10 of the surface integrated circuit card retainer 38. The operation of the surface integrated circuit card retainer 38, as well as the individual circuit card retainer 10, is discussed below.

While most directionally descriptive terms are being used wherein the configuration is such that the circuit card 40 is inserted in a vertical plane, other configurations are contemplated. In certain tower cases, or file servers, the computer cover (not shown) is removed from a side of the tower case, rather than from the top of the computer chassis 60 as shown in FIG. 3. It is to be understood that the directionally descriptive terms being used to describe the insertion/extraction of the circuit card 40 in a vertical plane could just as well be transformed to describe the insertion/extraction of the circuit card 40 in a horizontal or other plane. For example, to insert the circuit card 40 "downward" in a desktop computer encompasses the situation wherein insertion takes place on a horizontal plane within a tower computer system.

It should also be noted that for operational purposes, the inventive features of the individual circuit card retainer 10 and the surface integrated circuit card retainer 38 operate in the same manner. The main difference is that with the individual circuit card retainer 10, the individual circuit card retainers 10 can be supplied individually so as to facilitate the custom configuration of a computer system's circuit cards 40.

Circuit cards 40 do not always come in the same height. With individual circuit card retainers 10, each circuit card 40 of varying height can be individually matched with the appropriate individual circuit card retainer 10 by inserting the appropriate individual circuit card retainer 10 into the corresponding holes and/or slots (not shown) of the surface 4 for receiving individual circuit card retainers 10 according to the position of the specific circuit card on the motherboard (not shown), whereas the surface integrated circuit card retainer 38 has predefined heights which would have to be matched by the circuit card 40 being inserted into any given first groove 16 on the surface integrated circuit card retainer 38.

Operation of the Circuit Card Retainer

Referring now to FIGS. 3–6, the operation of the individual circuit card retainer 10 and the surface integrated circuit card retainer 38 are described. When installing the circuit card 40 into a computer system, the user removes a computer cover (not shown) from the computer chassis 60. The outer edge 48 of the circuit card 40 which comprises the bracket 52 and the bracket screw assembly 54 is lined up with the corresponding chassis bracket slot 62 (shown in FIG. 7) on the backside of the computer chassis 60. The inner edge 46 of the circuit card 40 is lined up with the appropriate first and second groove 16 and 24 on the individual circuit card retainer 10 or the surface integrated circuit card retainer 38. For disclosure purposes, the remaining description will assume that the individual circuit card retainer 10 is being used.

The circuit card 40 is then slid down the chassis bracket slot 62 and the first and second grooves 16 and 24 of the individual circuit card retainer 10. When sliding the inner edge 46 of the circuit card down the first and second grooves 16 and 24, the inner edge 46 of the circuit card 40 is the first portion to enter the second groove 24 which is defined by the third and fourth ridges 20, 22.

The location of the individual circuit card retainer 10 is such that the length of the circuit card 40 from the inner edge 46 to the outer edge 48 fits snugly between the chassis bracket slot 62 and the surface plane 18 of the individual circuit card retainer 10. Therefore, as the inner edge 46 of the circuit card 40 slides down the second groove 24, the inner edge 46 begins to exert a force against the inclined second groove surface 26, since this inclined second groove surface 26 reduces the length between the chassis bracket slot 62 and the surface plane 18 which provides the snug fit.

The individual circuit card retainer 10 is designed to flex at or near the flex zone 19 such that the groove abutment 28 portion of the individual circuit card retainer 10 flexes away from the inner edge 46 of the circuit card 40 as the inner edge 46 continues to apply pressure to the inclined second groove surface 26.

During this time, the lower edge 44 of the inner edge 46 begins to enter the first groove 16. When the upper edge 42 of the inner edge 46 slides beyond the groove abutment 28, the groove abutment 28 portion of the individual circuit card retainer 10 snaps back to its original unflexed position wherein the surface level of the inclined second groove surface 26 is above the surface plane 18.

In this "locked" position, the circuit card 40 cannot slide back up the second groove 24 since the upper edge 42 of the inner edge 46 abuts against the groove abutment 28 which has snapped back over the upper edge 42 of the inner edge 46. In this locked position, the circuit card 40 is inserted far enough such that the connector 50 of the circuit card 40 is firmly inserted into the corresponding motherboard connector 58. The bracket screw assembly 54 can then be secured the outer edge 48.

In order to remove the circuit card 40 from the motherboard connector 58, the bracket screw assembly 54 must be unscrewed. To move the groove abutment 28 below the surface level of the surface plane 18 such that it does not obstruct the upward travel of the upper edge 42 of the inner edge 46 of the circuit card 40, the press tab 30 is pressed in a direction away from the inner edge 46. This pressure on the press tab 30 will flex the groove abutment 28 portion of the individual circuit card retainer 10 in a manner so as to bring the inclined second groove surface 26 and the groove abutment 28 to a surface level equal to or below the surface plane 18. Once in this position, the groove abutment 28 will no longer obstruct the upward travel of the circuit card 40, and the circuit card 40 can be removed from the individual circuit card retainer 10.

Figure 7:
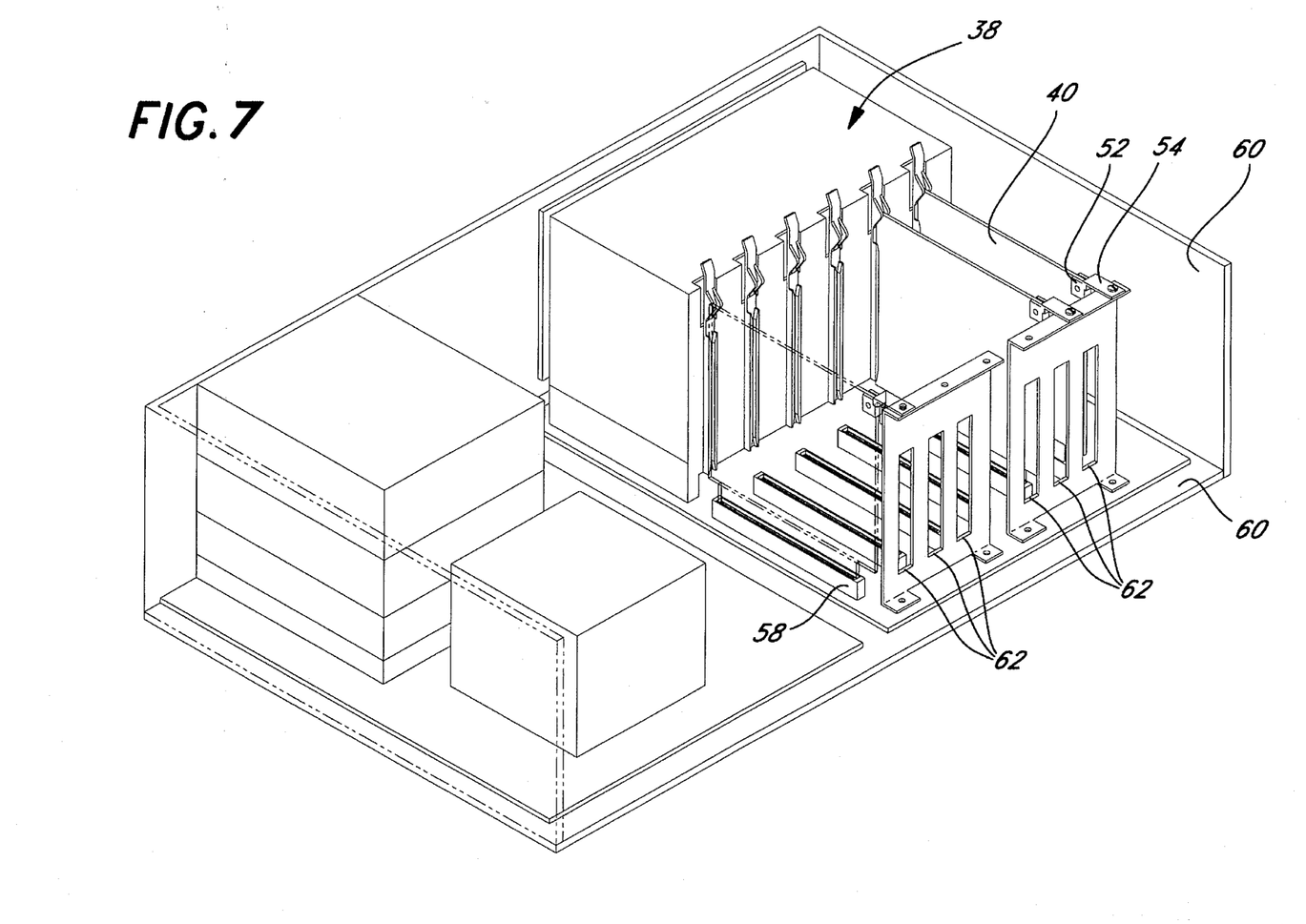
FIG. 7 is a perspective view of the surface integrated circuit card retainer positioned within a computer chassis.

FIG. 7 shows a perspective view of the circuit card 40 when properly installed into the individual circuit card retainer 10 or the surface integrated circuit card retainer 38.

Figure 8:
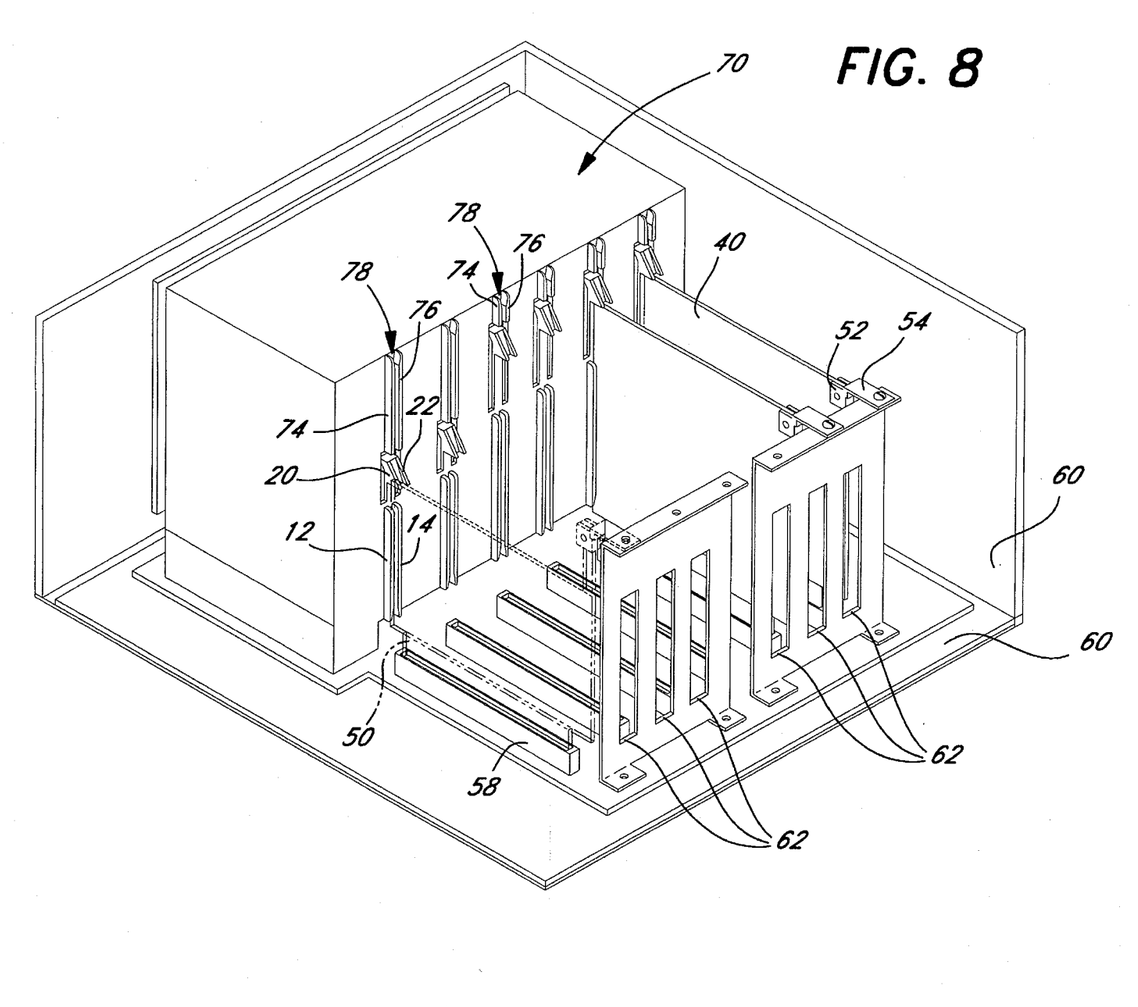
FIG. 8 is a perspective view of an alternative embodiment of a surface integrated circuit card retainer, wherein the surface comprises a portion of a compartmentalizing box, the figure showing the placement of the groove abutments of the individual receiving grooves at different heights so as to receive circuit cards of different heights.

FIG. 8 shows an alternative embodiment of a surface integrated circuit card retainer, hereinafter referred to as an alternative surface integrated circuit card retainer 70. The structural elements of this alternate embodiment are discussed below. FIG. 8 also shows an embodiment which provides groove abutments 28 positioned at different heights on the alternate surface integrated circuit card retainer 70. Since circuit cards 40 do come in more that one height, the retainers of the present invention accommodate these variations by positioning the groove abutments 28 accordingly.

Figure 9:
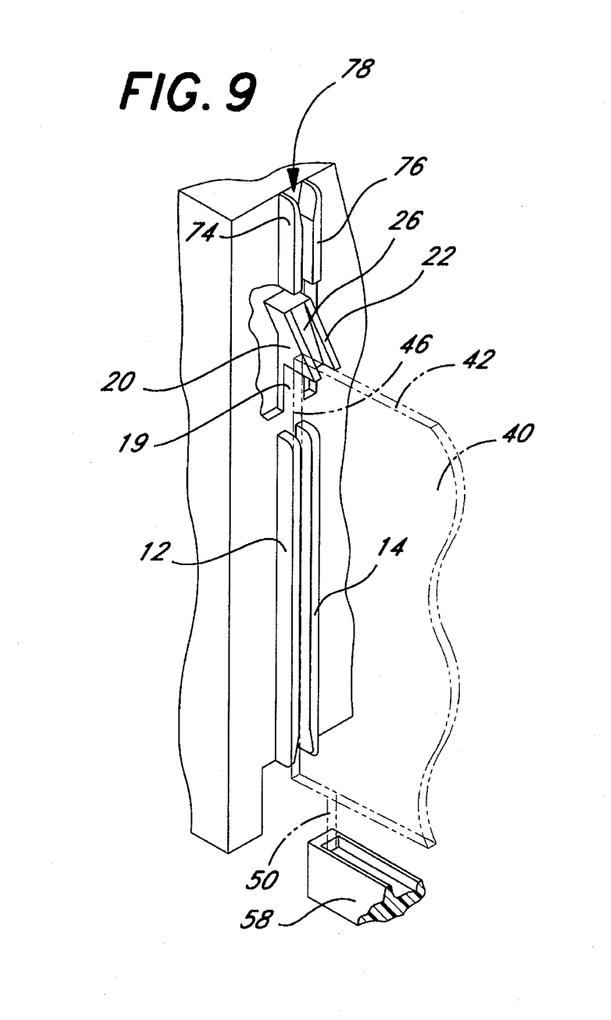
FIG. 9 is a partial perspective view of the alternative embodiment of a surface integrated circuit card retainer.
Figure 10:
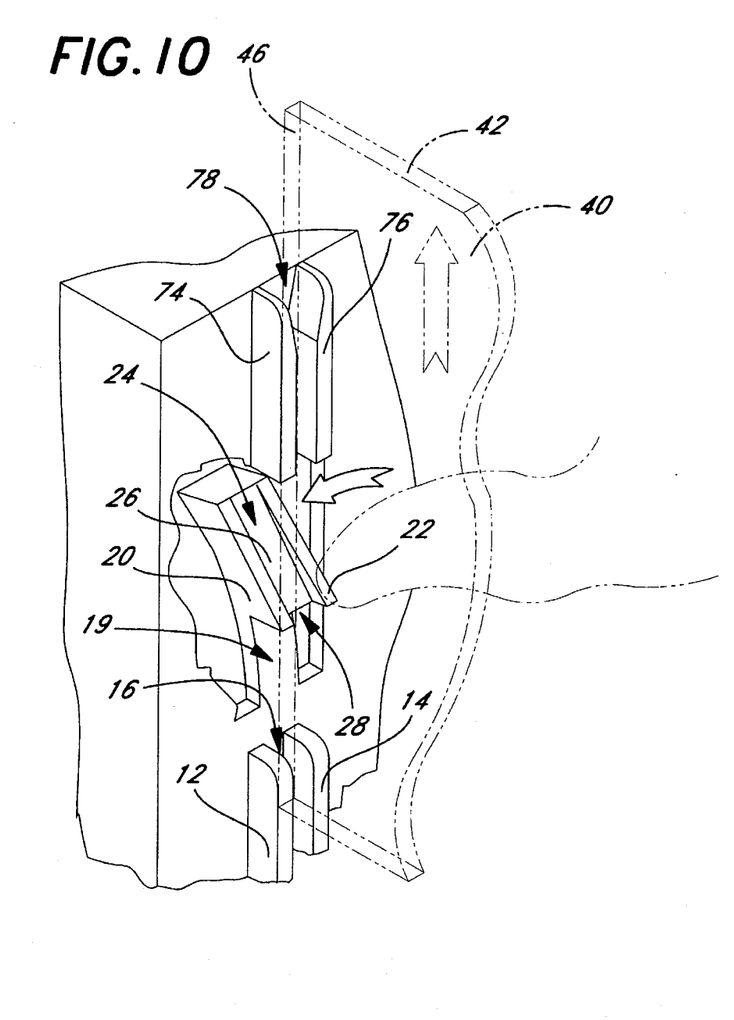
FIG. 10 is a detailed view of a portion of FIG. 9.

FIG. 9 and FIG. 10 show the details of the alternative surface integrated circuit card retainer 70. The alternative surface integrated circuit card retainer 70 of FIG. 9 and FIG. 10 operates in a similar manner as described for the individual circuit card retainer 10 and the surface integrated circuit card retainer 38. One of the differences to note is that there is no press tab 30. In the alternative embodiment, as shown in FIG. 9 and FIG. 10, to press the groove abutment 28 portion in a direction away from the inner edge 46, a person must apply pressure to the third or fourth ridges 20 or 22 (as shown in FIG. 10). This alternative embodiment is preferable if protrusions upward, such as the press tab 30 shown in FIG. 5, are not desired for space or other concerns.

It should also be noted that the alternative surface integrated circuit card retainer 70 also comprises a fifth and a sixth ridge 74, 76 which defines a third groove 78. This third groove 78 portion is detached from the second groove 24 portion so as to enable the second groove 24 portion to flex away from the inner edge 46 of the circuit card 40.

A person of ordinary skill in the art will understand that the inventive concepts disclosed for the individual circuit card retainer 10 and the surface integrated circuit card retainer 38 are equally applicable to the alternative surface integrated circuit card retainer 70.

While the above description contains many specificities, these should not be construed as limitations on the scope of the invention, but rather as an exemplification of one preferred embodiment thereof. Many other variations are possible.

For example, the third and fourth ridges 20 and 22, as well as the fifth and sixth ridges 74 and 76, can be tapered in a manner similar to the first and second ridges 12 and 14 (as shown for the fifth and sixth ridges 74 and 76 in FIG. 9 and FIG. 10) so as to provide for the easier insertion of the circuit card 40 into the respective groove defined by the corresponding pair of ridges.

Furthermore, although the disclosure describes the circuit card 40 connector 50 being inserted into the motherboard connector 58, it is understood that any appropriate computer system connector, whether located on the motherboard or not, can receive the circuit card 40 connector 50.

What is claimed is:

1. A circuit card retainer comprising a surface plane having a groove for receiving an edge of a circuit card, and said groove comprising an abutment wherein said abutment is movable to enable said abutment to be displaced upon insertion of the circuit card, and wherein said abutment prevents movement of the circuit card out of said circuit card retainer unless said abutment is moved independent of the circuit card and in a manner to permit such removal.

2. The circuit card retainer of claim 1, further comprising a first and a second ridge parallel to each other and integral to said surface plane defining said groove for receiving the edge of the circuit card, and said abutment is integral to a flexible portion of said groove such that said abutment allows the circuit card to be inserted into said groove by flexing away from the edge of the circuit card, and prevents the circuit card from being extracted from said groove unless said abutment is flexed away from the edge of the circuit card in a manner to permit such removal.

3. The circuit card retainer of claim 2 further comprising a third and a fourth ridge parallel to each other and in vertical alignment with said first and second ridge and integral to said surface plane further defining said groove, and said groove comprising an inclined surface which rises from said surface plane to a maximum surface level in the direction of said groove and then returns to said surface plane from the maximum surface level at approximately a perpendicular angle thereby forming said abutment.

4. The circuit card retainer of claim 3, further comprising one or more tabs located on a side of said surface plane opposite said first and second ridge, wherein said tabs allow said circuit card retainer to be attached to an appropriate and corresponding surface within a computer system for receiving said tabs.

5. The circuit card retainer of claim 2, further comprising a press tab integral to said flexible portion of said groove, said press tab providing a structure wherein the proper application of pressure on said press tab causes said abutment to flex away from the edge of the circuit card.

6. The circuit card retainer of claim 2, wherein said abutment can be positioned integrally to said flexible portion of said groove at various positions along said groove such that said circuit card retainer can accommodate circuit cards of varying height.

7. A circuit card retainer comprising a surface comprising one or more circuit card receiving channels wherein each circuit card receiving channel comprises a groove for receiving an edge of a circuit card, and said groove comprising an abutment wherein said abutment is movable to enable said abutment to be displaced upon insertion of the circuit card, and wherein said abutment prevents movement of the circuit card out of said circuit card retainer unless said abutment is moved independent of the circuit card and in a manner to permit such removal.

8. The circuit card retainer of claim 7, further comprising a first and a second ridge parallel to each other and integral to said surface plane defining said groove for receiving the edge of the circuit card, and said abutment is integral to a flexible portion of said groove such that said abutment allows the circuit card to be inserted into said groove by flexing away from the edge of the circuit card, and prevents the circuit card from being extracted from said groove unless said abutment is flexed away from the edge of the circuit card in a manner to permit such removal.

9. The circuit card retainer of claim 8, further comprising a third and a fourth ridge parallel to each other and in vertical alignment with said first and second ridge and integral to said surface plane further defining said groove, and said second groove comprising an inclined surface which rises from said surface plane to a maximum surface level in the direction of said groove and then returns to said surface plane from the maximum surface level at approximately a perpendicular angle thereby forming said abutment.

10. The circuit card retainer of claim 8, further comprising a press tab integral to said flexible portion of said groove, said press tab providing a structure wherein the proper application of pressure on said press tab causes said abutment to flex away from the edge of the circuit card.

11. The circuit card retainer of claim 8, wherein said abutment can be positioned integrally to said flexible portion of said groove at various positions along said groove such that said circuit card retainer can accommodate circuit cards of varying height.

12. The circuit card retainer of claim 8, wherein said surface can be located in various positions within a computer system such that said circuit card retainer can accommodate circuit cards of varying length.

13. A circuit card retainer comprising a receiving groove for receiving an edge of a circuit card wherein said edge of said circuit card defines a plane perpendicular to the circuit card and said edge comprises a top corner, said receiving groove comprising an abutment wherein said abutment circumscribes said top corner of said circuit card edge when said circuit card is fully received in said receiving groove and thereby substantially prevents withdrawal of the fully received circuit card from the receiving groove, said abutment being movable out of the plane defined by the circuit card edge to enable removal of said circuit card from the receiving groove.

14. A circuit card retainer comprising a surface comprising one or more receiving grooves, each receiving groove for receiving an edge of a circuit card wherein said circuit card edge comprises a top corner, said receiving groove comprising an abutment wherein said abutment circumscribes said top corner of said circuit card edge when said circuit card is fully received in said receiving groove and thereby substantially prevents withdrawal of the fully received circuit card from the receiving groove, said abutment being movable apart from the surface to enable removal of said circuit card from the receiving groove.

* * * * *